United States Patent
Ohno et al.

(10) Patent No.: US 7,192,651 B2
(45) Date of Patent: *Mar. 20, 2007

(54) RESIN COMPOSITION AND PREPREG FOR LAMINATE AND METAL-CLAD LAMINATE

(75) Inventors: Daisuke Ohno, Tokyo (JP); Kenji Ishii, Tokyo (JP); Yasumasa Norisue, Tokyo (JP); Michio Nawata, Tokyo (JP); Yoshinori Kondo, Tokyo (JP); Mitsuru Nozaki, Tokyo (JP); Seiji Shika, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 255 days.

This patent is subject to a terminal disclaimer.

(21) Appl. No.: 10/919,265

(22) Filed: Aug. 17, 2004

(65) Prior Publication Data

US 2005/0042466 A1    Feb. 24, 2005

(30) Foreign Application Priority Data

Aug. 20, 2003  (JP) ............................ 2003-296270
Sep. 22, 2003  (JP) ............................ 2003-330410

(51) Int. Cl.
  *B32B 15/08*  (2006.01)
  *C08F 16/12*  (2006.01)
  *C07C 43/215* (2006.01)

(52) U.S. Cl. ..................... 428/461; 428/901; 522/181; 526/333; 526/332; 568/630; 568/632; 568/635

(58) Field of Classification Search ................ 522/181; 556/333, 332; 568/630, 632, 635; 428/461, 428/907
See application file for complete search history.

(56) References Cited

U.S. PATENT DOCUMENTS 4,503,121 A    3/1985   Robeson et al.

6,995,195 B2 *  2/2006  Ishii et al. ................. 522/181

FOREIGN PATENT DOCUMENTS

| EP | 0 542 232 A1 | 5/1993 |
| EP | 1 384 733 A1 | 1/2004 |
| JP | 2002-216724 | * 2/2004 |

* cited by examiner

*Primary Examiner*—Kevin R. Kruer
(74) *Attorney, Agent, or Firm*—Wenderoth, Lind & Ponack, L.L.P.

(57) ABSTRACT

A resin composition for a laminate, containing at least 10% by weight of a vinyl compound represented by the formula (1), and a prepreg and a metal-clad laminate using the resin composition.

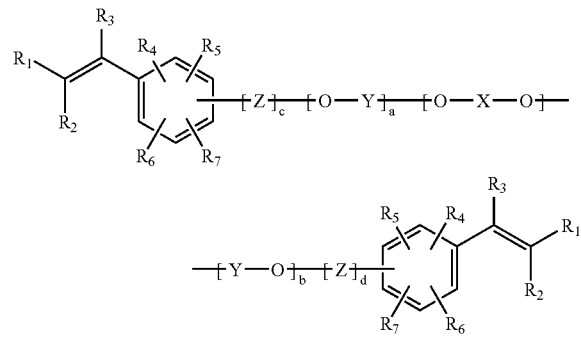

(1)

5 Claims, No Drawings

RESIN COMPOSITION AND PREPREG FOR LAMINATE AND METAL-CLAD LAMINATE

FIELD OF THE INVENTION

The present invention relates to a resin composition for a laminate, a prepreg for a laminate and a metal-clad laminate each of which uses a vinyl compound having a specific structure. More specifically, the resin composition for a laminate, provided by the present invention, is excellent in low dielectric characteristics and heat resistance and is capable of giving a prepreg which has no tackiness and excellent workability and is excellent in moldability when used for producing a metal-clad laminate. Therefore, it is suitable for producing telecommunications related equipment parts requiring a low loss of signals in a high frequency band or substrates of printed wiring boards used in computers having an operation frequency of more than several hundreds MHz, etc.

PRIOR ARTS OF THE INVENTION

In recent years, the signal band of information telecommunications equipment such as PHS, portable phones, etc., and the CPU clock time of computers have reached GHz bands and high frequencies are increasingly used. The dielectric loss of electric signals is in proportion to the product of the square root of the relative permittivity of an insulator which forms circuits, the dielectric loss tangent of the insulator, and the frequency of signals used. Accordingly, as the frequency of signals used becomes higher, the dielectric loss increases. The dielectric loss damps electric signals and therefore impairs the reliability of the signals. For this reason, it is required to select a material having a low dielectric constant and a low dielectric loss tangent as an insulator for preventing the above impairment. Removal of a polar group in a molecular structure is effective for lowering the dielectric constant and dielectric loss tangent of insulators. There are proposed a fluororesin, curable polyolefin, a cyanate ester type resin, curable polyphenylene oxide, allyl-modified polyphenylene ether (PPE), polyether imide modified with divinyl naphthalene, etc. However, the use of a thermoplastic resin such as PPE can provide low dielectric characteristics but has problems in workability, moldability and heat resistance. Further, as for a low molecular weight styrene compound such as divinyl benzene, this resin, when singly used, gives a cured product which is too hard and is therefore fragile, so that a prepreg obtained therefrom is insufficient in tackiness in some cases (for example, JP-A-2003-12710).

Compositions excellent in dielectric characteristics have high melting points and high softening points, so that they require a high temperature and a high pressure for molding, the moldability thereof is insufficient and cured products therefrom are too hard and are fragile and have problems in adhesiveness and resistance to soldering. Therefore, further improvements have been desired. As an example using vinyl compounds, there is proposed a method using polyether imide and a vinyl-divinyl copolymer for improving dielectric characteristics (JP-A-5-156159). However, there is a defect in that, during the production of the vinyl-divinyl copolymer, its monomer is apt to volatilize, which changes its constitution. There is also a problem that a cured product produced is fragile. Further, there is proposed a composition provided with flexibility by using a both terminals divinyl compound having an alkylene ether structure in its center, as a curing agent, into a novolak type aromatic hydrocarbon-formaldehyde resin (JP-A-5-78552), while its dielectric characteristics are unknown.

SUMMARY OF THE INVENTION

It is an object of the present invention to provide a resin composition for a laminate which composition has a low dielectric constant and a low dielectric loss tangent, is capable of giving a prepreg having no tackiness and does not decrease properties such as moldability and heat resistance, and a prepreg and a metal-clad laminate using the resin composition, for coping with recent usage modes using high frequencies.

The present invention provides a resin composition for a laminate, containing a vinyl compound of the following formula (1), a varnish obtainable by dissolving or dispersing the above resin composition in a solvent, a prepreg obtainable by using the above resin composition or the above varnish, and a metal-clad laminate obtainable by using the above prepreg.

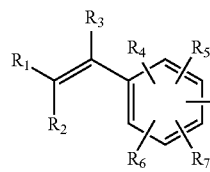 —$[Z]_c$—$[O-Y]_a$—$[O-X-O]$—$[Y-O]_b$—$[Z]_d$— 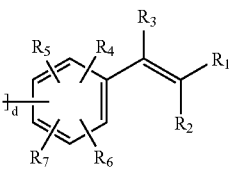

wherein:

$R_1, R_2, R_3, R_4, R_5, R_6$ and $R_7$ are the same or different and represent a hydrogen atom, a halogen atom, an alkyl group, a halogenated alkyl group or a phenyl group, —(O—X—O)— represents a moiety of the formula (2) or the formula (3) or represents at least two kinds of moieties of the formula (2) and/or the formula (3), $$-(O-X-O)- =$$ 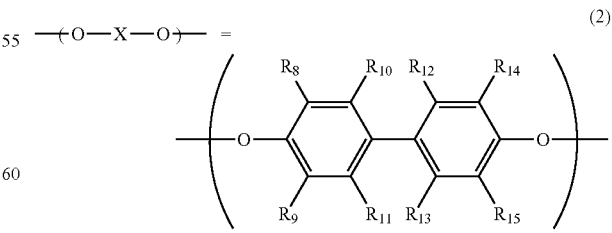

(2)

in which $R_8$, $R_9$, $R_{10}$, $R_{14}$ and $R_{15}$ are the same or different and represent a halogen atom, an alkyl group having 6 or less carbon atoms or a phenyl group and $R_{11}$, $R_{12}$ and $R_{13}$ are the same or different and represent a hydrogen atom, a halogen atom, an alkyl group having 6 or less carbon atoms or a phenyl group,

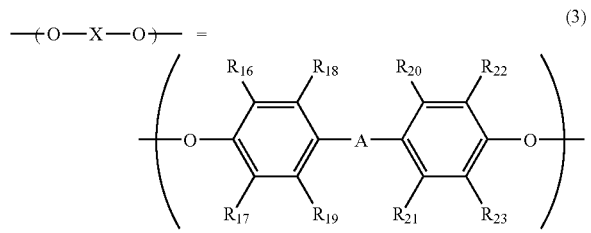

in which $R_{16}$, $R_{17}$, $R_{22}$ and $R_{23}$ are the same or different and represent a halogen atom, an alkyl group having 6 or less carbon atoms or a phenyl group, $R_{18}$, $R_{19}$, $R_{20}$ and $R_{21}$ are the same or different and represent a hydrogen atom, a halogen atom, an alkyl group having 6 or less carbon atoms or a phenyl group, and A is a linear, branched or cyclic hydrocarbon having 20 or less carbon atoms, —(Y—O)— is a moiety of the formula (4) or a random arrangement of at least two kinds of moieties of the formula (4),

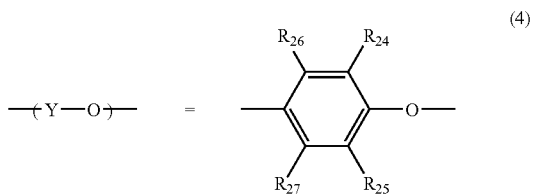

in which $R_{24}$ and $R_{25}$ are the same or different and represent a halogen atom, an alkyl group having 6 or less carbon atoms or a phenyl group and $R_{26}$ and $R_{27}$ are the same or different and represent a hydrogen atom, a halogen atom, an alkyl group having 6 or less carbon atoms or a phenyl group, Z is an organic group having at least one carbon atom which may contain an oxygen atom, a nitrogen atom, a sulfur atom or a halogen atom, each of a and b is an integer of 0 to 30, provided that at least one of a and b is not 0, and each of c and d is an integer of 0 or 1.

The present invention further provides a prepreg for a laminate which prepreg comprises a resin composition containing a vinyl compound of the formula (1) and a thermosetting resin and/or a thermoplastic resin and a base material, and a metal-clad laminate obtainable by using the above prepreg.

DETAILED DESCRIPTION OF THE INVENTION

The present inventors have made diligent studies and as a result found that a prepreg which is capable of giving a laminate having a low dielectric constant and a low dielectric loss tangent and has excellent moldability with no tackiness can be obtained by using a terminal vinyl compound of a bifunctional phenylene ether oligomer which compound has excellent dielectric characteristics and heat resistance of a Polyphenylene ether structure, has a number average molecular weight of 500–3,000 as required and has a specific structure. On the basis of the above finding, the present inventors have completed the present invention.

The present invention will be explained in detail hereinafter. First, the resin composition for a laminate, provided by the present invention, contains a vinyl compound of the formula (1). In the formula (1), $R_1$, $R_2$, $R_3$, $R_4$, $R_5$, $R_6$ and $R_7$ are the same or different and represent a hydrogen atom, a halogen atom, an alkyl group, a halogenated alkyl group or a phenyl group. —(O—X—O)— represents a moiety of the formula (2), in which $R_8$, $R_9$, $R_{10}$, $R_{14}$ and $R_{15}$ are the same or different and represent a halogen atom, an alkyl group having 6 or less carbon atoms or a phenyl group and $R_{11}$, $R_{12}$ and $R_{13}$ are the same or different and represent a hydrogen atom, a halogen atom, an alkyl group having 6 or less carbon atoms or a phenyl group, or a moiety of the formula (3), in which $R_{16}$, $R_{17}$, $R_{22}$ and $R_{23}$ are the same or different and represent a halogen atom, an alkyl group having 6 or less carbon atoms or a phenyl group, $R_{18}$, $R_{19}$, $R_{20}$ and $R_{21}$ are the same or different and represent a hydrogen atom, a halogen atom, an alkyl group having 6 or less carbon atoms or a phenyl group, and A is a linear, branched or cyclic hydrocarbon having 20 or less carbon atoms, or —(O—X—O)— represents at least two kinds of moieties of the formula (2) and/or the formula (3). —(Y—O)— is a moiety of the formula (4) or a random arrangement of at least two kinds of moieties of the formula (4), in which $R_{24}$ and $R_{25}$ are the same or different and represent a halogen atom, an alkyl group having 6 or less carbon atoms or a phenyl group and $R_{26}$ and $R_{27}$ are the same or different and represent a hydrogen atom, a halogen atom, an alkyl group having 6 or less carbon atoms or a phenyl group. Z is an organic group having at least one carbon atom which may contain an oxygen atom, a nitrogen atom, a sulfur atom or a halogen atom. Each of a and b is an integer of 0 to 30, provided that at least one of a and b is not 0. Each of c and d is an integer of 0 or 1.

In the compounds of the formula (1), preferred is a compound of the formula (1) wherein $R_1$, $R_2$, $R_3$, $R_4$, $R_5$, $R_6$ and $R_7$ are hydrogen atoms, $R_8$, $R_9$, $R_{10}$, $R_{14}$, $R_{15}$, $R_{16}$, $R_{17}$, $R_{22}$ and $R_{23}$ are alkyl groups having 3 or less carbon atoms, $R_{11}$, $R_{12}$, $R_{13}$, $R_{18}$, $R_{19}$, $R_{20}$ and $R_{21}$ are hydrogen atoms or alkyl groups having 3 or less carbon atoms, Z are methylene groups, and each of c and d is 1. When the number average molecular weight of the compound of the formula (1) is smaller than 500, a prepreg obtained therefrom is poor in tackiness and it is hard to impart dielectric characteristics. When the number average molecular weight is larger than 3,000, the melting point increases, which decreases the solubility or reactivity thereof to a solvent and therefore worsens moldability. For these reasons, the number average molecular weight is preferably 500 to 3,000.

The amount of the vinyl compound of the formula (1) to be used is not specially limited. However, when the content thereof is small, desired low dielectric characteristics, heat resistance and tackiness cannot be obtained. For this reason, the content of the vinyl compound of the formula (1) in the resin composition for a laminate is preferably 10 to 100% by weight, more preferably 30 to 100% by weight, further preferably 50 to 100% by weight.

The process for producing the vinyl compound of the formula (1) used in the resin composition for a laminate of the present invention is not specially limited and the vinyl compound of the formula (1) may be produced by any process. For example, it can be produced by processes disclosed in JP-A-2004-059644, JP-A-2004-067727 and Japanese patent application No. 2003-110687.

A resin composition for a flame-retardant laminate can be prepared by adding a flame retardant to the resin composition for a laminate of the present invention. The flame retardant may be selected from known ones. Examples thereof include halogen type flame retardants such as a brominated epoxy resin, brominated polycarbonate, brominated polystyrene, brominated styrene, brominated phthalimide, tetrabromobisphenol A, pentabromobenzyl(meth)acrylate, pentabromotoluene, tribromophenol, hexabromobenzene, decabromophenyl ether, chlorinated polystyrene and chlorinated paraffin; phosphorus type flame retardants such as red phosphorus, tricresyl phosphate, triphenyl phosphate, cresyldiphenyl phosphate, trixyl phosphate, trialkyl phosphate, dialkyl phosphate, tris(chloroethyl)phosphate and phosphazene; and inorganic flame retardants such as aluminum hydroxide, magnesium hydroxide, zinc borate, antimony trioxide and magnesium silicate. These flame retardants may be used alone or in combination.

Although the resin composition for a laminate of the present invention undergoes curing itself under heat, a heat-curing catalyst can be incorporated in the composition for increasing the curing rate and thereby improving workability and economic efficiency. The heat-curing catalyst is selected from those heat-curing catalysts which are capable of generating cationic or radical active species, which can initiate polymerization of a vinyl group, with heat or light. For example, a cationic polymerization initiator includes diallyl iodonium salt, triallyl sulfonium salt and aliphatic sulfonium salt each of which uses $BF_4$, $PF_6$, $AsF_6$ or $SbF_6$ as a pairing anion. There maybe used commercially available products such as SP70, SP172 and CP 66, supplied by Asahi Denka Kogyo K. K., CI2855 and CI2823 supplied by Nippon Soda Co., Ltd., and SI100L and SI150L supplied by Sanshin Chemical Industry Co., Ltd. A radical polymerization initiator includes benzoin compounds such as benzoin and benzoin methyl; acetophenone compounds such as acetophenone and 2,2-dimethoxy-2-phenylacetophenone; thioxanthone compounds such as thioxanthone and 2,4-diethylthioxanthone; bisazido compounds such as 4,4'-diazidochalcone, 2,6-bis(4'-azidobenzal)cyclohexanone and 4,4'-diazidobenzophenone; azo compounds such as azobisisobutyronitrile, 2,2-azobispropane and hydrazone; organic peroxides such as 2,5-dimethyl-2,5-di(t-butylperoxy)hexane, 2,5-dimehtyl-2,5-di(t-butylperoxy)hexyne-3 and dicumyl peroxide. These can be used alone or in combination.

The resin composition for a laminate of the present invention may contain a polymerization inhibitor for increasing its preservation stability. The polymerization inhibitor may be selected from generally known polymerization inhibitors. Examples thereof include quinines such as hydroquinone, methyl hydroquinone, p-benzoquinone, chloranil and trimethylquinone, and aromatic diols. These polymerization inhibitors may be used alone or in combination.

The resin composition for a laminate of the present invention may contain a known filler, a coupling agent, a thermosetting resin, a thermoplastic resin, a dye, a pigment, a thickener, a lubricant, an antifoamer, an ultraviolet absorber, etc., for adjusting its physical properties, as required.

Examples of the filler include fibrous fillers such as a glass fiber, a carbon fiber, an aramid fiber, a silicone carbide fiber, an alumina fiber and a boron fiber, inorganic whiskers such as silicone carbide, silicon nitride, magnesium oxide, potassium titanate and aluminoborate, inorganic acicular fillers such as wollastonite, sonolite, MOS, a phosphate fiber and sepiolite, inorganic spherical fillers such as fused silica, talc, alumina, barium titanate, mica and glass beads, and organic fillers such as particulate polymers obtainable by crosslinking of (meth)acrylic acid ester, styrene, etc. These fillers may be used alone or in combination.

Examples of the coupling agent include silane type coupling agents such as vinyltrichlorosilane, vinyltriethoxysilane, vinyltrimethoxysilane, γ-methacryloxypropyltrimethoxysilane, β-(3,4-epoxycyclohexyl)ethyltrimethoxysilane, γ-glycidoxypropylmethyldiethoxysilane, N-β-aminoethyl-γ-aminopropylmethylmethoxysilane, γ-aminopropyltriethoxysilane, N-phenyl-γ-aminopropyltrimethoxysi lane, γ-mercaptopropyltrimethoxysilane and γ-chloropropyltrimethoxysilane, titanate type coupling agents, aluminum type coupling agents, zircoaluminate type coupling agents, silicone type coupling agents and fluorine type coupling agents. These coupling agents may be used alone or in combination.

The thermosetting resin used in the resin composition of the present invention is not specially limited so long as it is selected from those thermosetting resins which are used for a printed wiring material. Typical examples of the thermosetting resin include an epoxy resin, a cyanate ester resin, a bismaleimide-cyanate ester resin, a maleimide resin, a polyimide resin and an unsaturated-group-containing polyphenylene ether resin. These thermosetting resins may be used alone or in combination as required. The epoxy resin or cyanate ester resin is preferable. The thermosetting resin used in the present invention may be used in combination with a curing agent and a curing accelerator for thermosetting resins, as required. The curing agent and the curing accelerator are known and are not specially limited so long as they are generally used as a curing agent and a curing accelerator for thermosetting resins.

The epoxy resin preferably used in the present invention is not specially limited so long as it is a compound having at least two epoxy groups per molecule. Concretely, examples thereof include bisphenol A type epoxy, bisphenol F type epoxy, bisphenol Z type epoxy, biphenol type epoxy, tetramethylbiphenol type epoxy, hexamethylbiphenol type epoxy, xylene novolak type epoxy, biphenyl novolak type epoxy, dicyclopentadiene novolak type epoxy, phenol novolak type epoxy, cresol novolak type epoxy, and flame-retardant epoxy resins obtained by brominating these epoxy resins. These epoxy resins may be used alone or in combination.

The cyanate ester resin preferably used in the present invention is not specially limited so long as it is a compound having at least two cyanate groups per molecule. Concretely, examples thereof include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dibromo-4-cyanatophenyl)propane, bis(4-cyanatophenyl)ether, and cyanates obtained by a reaction of novolak with cyanogen halide. These cyanate ester resins may be used alone or in combination.

Other resins usable in the present invention include (meth)acrylates such as bisphenol A type epoxy(meth)acrylate, phenol novolak type epoxy(meth)acrylate, trimethylolpropane tri(meth)acrylate and dipentaerythritol hexa(meth)acrylate, vinyl compounds such as styrene, divinylbenzene and divinylnaphthalene, an oxetane resin, etc. These resins may be used alone or in combination.

Examples of the thermoplastic resin used in the present invention include polystyrene, polyphenylene ether, polycarbonate, polyethylene, polypropylene, polybutadiene, polymethyl methacrylate, a styrene-butadiene copolymer, a styrene-butadiene-styrene copolymer, polyester, polyamide, polyimide, an acrylic resin, a methacrylic resin, ABS resin, polysulfone, etc. These thermoplastic resins may be used alone or in combination.

Then, the prepreg of the present invention will be explained. The prepreg of the present invention can by obtained by dissolving or dispersing the resin composition for a laminate of the present invention in a solvent to prepare a varnish, impregnating a base material with the varnish and drying the resultant base material.

Examples of the solvent include acetone, methyl ethyl ketone, ethylene glycol monomethyl ether acetate, propylene glycol dimethyl ether, toluene, xylene, tetrahydrofuran and N,N-dimethylformamide. The solvent is not specially limited to these examples. These solvents may be used alone or in combination.

The base material includes all base materials used for thermosetting resin laminates. Examples thereof include various glass clothes such as E glass cloth, NE glass cloth and D glass cloth, natural inorganic fiber fabrics, woven fabrics and nonwoven fabrics obtained from liquid crystal fibers such as an aromatic polyamide fiber or an aromatic polyester fiber, woven fabrics and nonwoven fabrics obtained from synthetic fibers such as a polyvinyl alcohol fiber, a polyester fiber or an acrylic fiber, natural fiber nonwoven fabrics such as cotton fabric, linen fabric or felt, a carbon fiber fabric, natural cellulose type fabrics such as kraft paper, cotton paper or paper-glass combined paper, porous PTFE, etc. Of these, base materials excellent in low dielectric characteristics such as D glass cloth, NE glass cloth, organic nowoven fabrics and porous PTFE are preferably used.

A polymer base material is particularly preferably used in the present invention. The polymer base material is not specially limited so long as it is a woven fabric, a nonwoven fabric, a sheet or a porous body each of which uses a polymer. Examples thereof concretely include liquid crystal polymers such as lyotropic liquid crystal polymers typified by aromatic polyamide, polyphenylene benzothiazole, etc., thermotropic liquid crystal polymers typified by aromatic polyester, polyesteramide, etc., a polyamide, an aramid resin, polyphenylene ether, polyphenylene sulfide, polyethylene, polypropylene, a fluororesin, etc. The polymer is properly selected depending upon an intended application or performance as required. These polymers may be used alone or in combination as required. The thickness of the base material is not specially limited. Generally, it is about 3 to 200 μm.

The process for producing the prepreg of the present invention is not specially limited so long as it can combine a resin composition containing the vinyl compound of the formula (1) as an essential component and a base material to produce the prepreg. Concretely, an example thereof is a method in which the above resin composition is impregnated or applied into/to the base material and then heated in a dryer at 80 to 200° C. for 1 to 90 minutes to B-stage the resin composition and thereby to produce prepreg. The resin content of the prepreg is 30 to 90% by weight.

Then, the metal-clad laminate of the present invention will be explained. The metal-clad laminate of the present invention can be obtained by stacking one prepreg or at least two prepregs of the present invention, laminating metal foil(s), such as copper foil or aluminum foil, on upper and lower surfaces or one surface of the stacked prepreg(s) and heating and pressurizing the resultant set. As the metal foil, for example, there may be used an electrolytic copper foil, a rolled copper foil, etc.

General techniques of a laminate and a multilayer board for printed wiring boards can be applied for the molding conditions of the metal-clad laminate. For example, generally, a multiplaten press, a multiplaten vacuum press, continuous molding, an autoclave molding machine or the like is used, the temperature is 100–300° C., the pressure is 0.2–10 MPa, and the heating time is 0.1–5 hours. Further, it is also possible to produce a multilayer board by combining the prepreg of the present invention with an internal layer wiring board which is separately prepared and laminate-molding the resultant set.

The resin composition for a laminate, provide by the present invention, has low dielectric characteristics and high heat resistance and is capable of giving a prepreg having excellent moldability and no tackiness. Therefore, the resin composition of the present invention is suitable for insulating materials of high-frequency electronic parts and is suitable for use in wiring substrates for high-frequency signals and prepregs used therefor.

EXAMPLES

The present invention will be explained more concretely with reference to Examples and Comparative Examples hereinafter, while the present invention shall not be limited to these Examples.

Synthetic Example 1

(Synthesis of Bifunctional Phenylene Ether Oligomer)

A longitudinally long reactor having a volume of 12 liters and equipped with a stirrer, a thermometer, an air-introducing tube and baffle plates was charged with 3.88 g (17.4 mmol) of $CuBr_2$, 0.75 g (4.4 mmol) of N,N'-di-t-butylethylenediamine, 28.04 g (277.6 mmol) of n-butyldimethylamine and 2,600 g of toluene. The components were stirred at a reaction temperature of 40° C. A mixed solution was obtained by dissolving 129.32 g (0.48 mol) of 2,2'-,3,3'-,5,5'-hexamethyl-(1,1'-biphenol)-4,4'-diol, 292.19 g (2.40 mol) of 2,6-dimethylphenol, 0.51 g (2.9 mmol) of N,N'-di-t-butylethylenediamine and 10.90 g (108.0 mmol) of n-butyldimethylamine in 2,300 g of methanol (molar ratio of a bivalent phenol of the formula (2): a monovalent phenol of the formula (4)=1:5), in advance. The mixed solution was dropwise added to the mixture in the reactor over 230 minutes while carrying out bubbling with 5.2 L/min of a nitrogen-air mixed gas having an oxygen concentration of 8%, and stirring was carried out. After the completion of the addition, 1,500 g of water in which 19.89 g (52.3 mmol) of tetrasodium ethylenediamine tetraacetate was dissolved was added to the stirred mixture to terminate the reaction. An aqueous layer and an organic layer were separated. Then, the organic layer was washed with 1N hydrochloric acid aqueous solution and then washed with pure water. The thus-obtained solution was concentrated by an evaporator to 50 wt %, to obtain 833.40 g of a toluene solution of a bifunctional phenylene ether oligomer (resin A). The resin A had a number average molecular weight of 930, a weight average molecular weight of 1,460 and a hydroxyl group equivalent of 465.

(Synthesis of Vinyl Compound)

A reactor equipped with a stirrer, a thermometer and a reflux tube was charged with 833.40 g of the toluene solution of resin A, 160.80 g of vinyl benzyl chloride (trade name CMS-P; supplied by Seimi Chemical Co., Ltd.), 1,600 g of methylene chloride, 12.95 g of benzyl dimethyl amine, 420 g of pure water and 175.9 g of 30.5 wt % NaOH solution, and the mixture was stirred at a reaction temperature of 40° C. After 24 hours stirring, an organic layer was washed with 1N hydrochloric acid aqueous solution and then washed with pure water. The thus-obtained solution was concentrated by an evaporator and then dropped into methanol to obtain a solid. The solid was recovered by filtration and vacuum-dried to obtain 501.43 g of a resin B. The resin B had a number average molecular weight of 1,165 and a weight average molecular weight of 1,630.

Synthetic Example 2

(Synthesis of Bifunctional Phenylene Ether Oligomer)

A longitudinally long reactor having a volume of 12 liters and equipped with a stirrer, a thermometer, an air-introducing tube and baffle plates was charged with 13.1 g (0.12 mol) of CuCl, 707.0 g (5.5 mol) of di-n-butylamine and 4,000 g of methyl ethyl ketone. The components were stirred at a reaction temperature of 40° C. A mixed solution was obtained by dissolving 410.2 g (1.6 mol) of 4,4'-methylenebis(2,6-dimethylphenol) and 586.5 g (4.8 mol) of 2,6-dimethylphenol in 8,000 g of methyl ethyl ketone, in advance. The mixed solution was dropwise added to the mixture in the reactor over 150 minutes while carrying out bubbling with 2 L/min of air and stirring was carried out. A disodium dihydrogen ethylenediamine tetraacetate aqueous solution was added to thereto, to terminate the reaction. Then, washing was carried out with 1N hydrochloric acid aqueous solution three times and then washing was carried out with ion-exchanged water. The thus-obtained solution was concentrated by an evaporator and then dried under a reduced pressure, to obtain 946.6 g of a bifunctional phenylene ether oligomer (resin C). The resin C had a number average molecular weight of 801, a weight average molecular weight of 1,081 and a hydroxyl group equivalent of 455.

(Synthesis of Vinyl Compound)

A reactor equipped with a stirrer, a thermometer and a reflux tube was charged with 480.0 g of the resin C, 260.2 g of vinyl benzyl chloride (trade name CMS-P; supplied by Seimi Chemical Co., Ltd.), 2,000 g of tetrahydrofuran, 240.1 g of potassium carbonate and 60.0 g of 18-crown-6-ether, and the mixture was stirred at a reaction temperature of 30° C. After 6 hours stirring, the mixture was concentrated by an evaporator, diluted with 2,000 g of toluene and washed with water. An organic layer was concentrated and then dropped into methanol to obtain a solid. The solid was recovered by filtration and vacuum-dried to obtain 392.2 g of a resin D. The resin D had a number average molecular weight of 988 and a weight average molecular weight of 1,420.

Comparative Synthetic Example 1

(Synthesis of Vinyl Compound)

A reactor equipped with a stirrer, a thermometer and a reflux tube was charged with 150.4 g of bisphenol A, 223.8 g of chloromethylstyrene (supplied by Seimi Chemical Co., Ltd.; CMS-P), 2,250 g of methylene chloride, 24.7 g of tri-n-butylamine, 2,000 g of pure water and 209.8 g of 30.5 wt % NaOH solution, and the mixture was stirred at a reaction temperature of 35° C. After 24 hours stirring, an organic layer was washed with 1N hydrochloric acid aqueous solution and then washed with pure water. The organic layer was concentrated by an evaporator and vacuum-dried to obtain 295.1 g of a resin E.

Examples 1–3, Comparative Examples 1–2

The resins B, D and/or E obtained in Synthetic Examples 1 and 2 and Comparative Synthetic Example 1 or divinylbenzene (supplied by Nippon Steel Chemical Co., Ltd.; DVB-960) in a ratio shown in Table 1 were dissolved in methyl ethyl ketone to prepare a varnish having a resin content of 60 wt %. The prepared varnish was impregnated into a glass cloth (supplied by Nitto Boseki Co., Ltd.; NEA2116) and it was treated with a hot-air dryer at a temperature of 160° C. for 3 minutes to prepare a prereg. The prepreg was evaluated for tackiness. Table 1 shows results.

Tackiness: The prepeg was judged for tackiness by touching the prepreg with fingers.

o: No tackiness.
x: Tackiness found.

TABLE 1

|  | Ex. 1 | Ex. 2 | Ex. 3 | CEx. 1 | CEx. 2 |
|---|---|---|---|---|---|
| Resin B | 100 | — | 50 | — | — |
| Resin D | — | 100 | — | — | — |
| Resin E | — | — | 50 | 100 | — |
| Divinylbenzene | — | — | — | — | 100 |
| Tackiness | o | o | o | X | Prepreg was not obtained |

Ex. = Example,
CEx. = Comparative Example

Examples 4–6, Comparative Example 3

A resin composition having a ratio shown in Table 2 was dissolved in methyl ethyl ketone, to prepare a varnish having a resin content of 60 wt %. The varnish was impregnated into a glass cloth (supplied by Nitto Boseki Co., Ltd.; NEA2116) and it was treated with a hot-air dryer at a temperature of 160° C. for 3 minutes to prepare prepregs. Four prepregs obtained above were stacked and 18 µm thick electrolytic copper foils (supplied by Mitsui Mining and Smelting Co., Ltd., trade name: 3EC-III) were laminated on both surfaces of the stacked prepregs, one copper foil on each surface, and the resultant set was pressed at a temperature of 200° C. under a pressure of 2 MPa for 2 hours to prepare a double-sided copper-clad laminate having a thickness of 0.4 mm. Further, the prepregs obtained above were placed on both surfaces of a double-side patterned core material (supplied by Mitsubishi Gas Chemical Company, Inc., EL190), one prepreg on each surface, 18 µm thick electrolytic copper foils (supplied by Mitsui Mining and Smelting Co., Ltd., trade name: 3EC-III) were laminated on both the surfaces, one copper foil on each surface, and the resultant set was pressed at a temperature of 200° C. at a pressure of 2 MPa for 2 hours, to obtain a four-layered board.

TABLE 2

|  | Ex. 4 | Ex. 5 | Ex. 6 | CEx. 3 |
|---|---|---|---|---|
| Resin B | 100 | — | 50 | — |
| Resin D | — | 100 | — | — |

TABLE 2-continued

|  | Ex. 4 | Ex. 5 | Ex. 6 | CEx. 3 |
|---|---|---|---|---|
| Resin E | — | — | 50 | — |
| PPE | — | — | — | 30 |
| Cyanate resin | — | — | — | 30 |
| Epoxy resin | — | — | — | 40 |
| Curing accelerator | — | — | — | 0.04 |

Ex. = Example,
CEx. = Comparative Example

PPE: supplied by Mitsubishi Gas Chemical Company, Inc., weight average molecular weight: 24,000

Cyanate resin: prepolymer of 2,2-bis(4-cyanatophenyl)propane (supplied by Mitsubishi Gas Chemical Company, Inc.)

Epoxy resin: bisphenol A epoxy (DER-331L: supplied by Dow Chemical Japan)

Curing accelerator: iron acetylacetonate

The copper foils of the obtained double-side copper-clad laminate were removed by etching, and a glass transition temperature, a dielectric constant, a dielectric loss tangent and a moisture absorption heat resistant were evaluated.

The external copper foils of the obtained four-layered board were removed by etching, and embeddability of an internal layer pattern having a copper foil thickness of 35 μm was evaluated.

Table 3 shows results.

Glass transition temperature: Obtained by a loss tangent (tan δ) peak in a dynamic viscoelasticity measurement.

Dielectric constant and dielectric loss tangent: Obtained by a cavity resonance perturbation method.

Moisture absorption heat resistance: A specimen was treated under PCT conditions of 121° C./2 atm for 3 hours, and then the specimen was immersed in a solder bath at 260° C. for 30 seconds to check the occurrence of swelling by visual observation.

o: No swelling found.
x: Swelling found.

Moldability: Embeddability of an internal layer pattern having a copper foil thickness of 35 μm was visually observed.

o: No void.
x: Void found.

TABLE 3

|  | Ex. 4 | Ex. 5 | Ex. 6 | CEx. 3 |
|---|---|---|---|---|
| Glass transition temperature (° C.) | 232 | 210 | 204 | 202 |
| Dielectric constant (10 GHz) | 3.2 | 3.2 | 3.3 | 3.4 |
| Dielectric loss tangent (10 GHz) | 0.0031 | 0.0033 | 0.0045 | 0.0064 |
| Moisture absorption heat resistance | ◯ | ◯ | ◯ | X |
| Moldability | ◯ | ◯ | ◯ | X |

Ex. = Example,
CEx. = Comparative Example

Examples 7–9

A resin composition having a ratio shown in Table 4 was dissolved in methyl ethyl ketone to prepare a varnish having a resin content of 60 wt %. The prepared varnish was impregnated into a glass cloth (supplied by Nitto Boseki Co., Ltd.; NEA2116) and it was treated with a hot-air dryer at a temperature of 160° C. for 3 minutes to prepare preregs. Four prepregs obtained above were stacked and 18 μm thick electrolytic copper foils (supplied by Mitsui Mining and Smelting Co., Ltd., trade name: 3EC-III) were laminated on both surfaces of the stacked prepregs, one copper foil on each surface, and the resultant set was pressed at a temperature of 200° C. at a pressure of 2 MPa for 2 hours to prepare a double-sided copper-clad laminate having a thickness of 0.4 mm.

TABLE 4

|  | Example 7 | Example 8 | Example 9 |
|---|---|---|---|
| Resin B | 90 | 100 | 80 |
| Brominated polycarbonate | 10 | — | — |
| Aluminum hydroxide | — | 100 | — |
| Phosphazene | — | — | 20 |

Brominated polycarbonate: FG8500 supplied by Teijin Chemicals Ltd.

Aluminum hydroxide: CL303 supplied by Sumitomo Chemical Co., Ltd.

Phosphazene: SPB-100 supplied by Otsuka Chemical Co., Ltd.

The copper foils of the obtained double-side copper-clad laminate were removed by etching, and a glass transition temperature, a dielectric constant, a dielectric loss tangent, a moisture absorption heat resistant and flame resistance were evaluated. Table 5 shows results.

Glass transition temperature: Obtained by a loss tangent (tan δ) peak in a dynamic viscoelasticity measurement.

Dielectric constant and dielectric loss tangent: Obtained by a cavity resonance perturbation method.

Moisture absorption heat resistance: A specimen was treated under PCT conditions of 121° C./2 atm for 3 hours, and then the specimen was immersed in a solder bath at 260° C. for 30 seconds to check the occurrence of swelling by visual observation.

o: No swelling found.
x: Swelling found.

Flame resistance: A flame extinction time was measured according to the UL94 test method.

TABLE 5

|  | Ex. 7 | Ex. 8 | Ex. 9 |
|---|---|---|---|
| Glass transition temperature (° C.) | 223 | 230 | 215 |
| Dielectric constant (10 GHz) | 3.2 | 3.2 | 3.4 |
| Dielectric loss tangent (10 GHz) | 0.0056 | 0.0029 | 0.0058 |
| Moisture absorption heat resistance | ◯ | ◯ | ◯ |
| Flame resistance | V-0 | V-1 | V-0 |

Ex. = Example,
CEx. = Comparative Example

Examples 10–11

The resin "B" and the resin "D" obtained in Synthetic Examples 1 and 2 were respectively dissolved in methyl ethyl ketone to obtain varnishes having a resin content of 60% each. Aromatic polyester nonwoven fabrics (Vecls, weight: 50 g/m², supplied by KURARAY CO., LTD.) were impregnated with the varnishes respectively and then dried at 160° C. for 3 minutes, to obtain a prepreg B and a prepreg D each of which had no tackiness and had a gelation time at 170° C. of 120–150 seconds. Then, four prepregs B were stacked, 12 µm-thick electrolytic copper foils were disposed on both surfaces of the stacked prepregs, one copper foil on each surface, and the resultant set was pressed at a temperature of 200° C. under a pressure of 2 MPa for 2 hours to prepare a double-sided copper-clad laminate having a thickness of 0.4 mm. Further, the above procedures were repeated except that the four prepregs B were replaced with four prepregs D, to prepare a double-sided copper-clad laminate having a thickness of 0.4 mm. Further, prepregs B were disposed on both surfaces of a double-side patterned core material (copper foil thickness 35 µm), one prepreg B on each surface, 12 µm-thick electrolytic copper foils were disposed thereon, one copper foil on each surface, and the resultant set was pressed at a temperature of 200° C. under a pressure of 2 MPa for 2 hours, to obtain a four-layered board. Further, the above procedures were repeated except that the prepregs B were replaced with prepregs D, to prepare a four-layered board. The double-sided copper-clad laminates were evaluated for properties and the four-layered boards were evaluated for moldability. Table 7 shows results thereof.

Examples 12–15

Components were mixed in amounts shown in Table 6 to prepare a varnish having a resin content of 60%. A base material shown in Table 6 was immersed in the varnish to impregnate the base material with resin, and then the base material was dried at a temperature of 160° C. for 3 minutes, whereby preregs were obtained. Four prepregs obtained above were stacked and 12 µm thick electrolytic copper foils were disposed on the upper and lower surfaces of the stacked prepregs, one copper foil on each surface, and the resultant set was pressed at a temperature of 200° C. under a pressure of 2 MPa for 2 hours to prepare a double-sided copper-clad laminate having a thickness of 0.4 mm. Further, the prepregs were placed on both surfaces of a double-side patterned core material (copper foil thickness 35 µm), one prepreg on each surface, 18 µm thick electrolytic copper foils were disposed thereon, one copper foil on each surface, and the resultant set was pressed at a temperature of 200° C. at a pressure of 2 MPa for 2 hours, to obtain a four-layered board. The double-sided copper-clad laminate was evaluated for properties and the four-layered board was evaluated for moldability. Table 7 shows results thereof.

Comparative Examples 4–5

Components were mixed in amounts shown in Table 6 to prepare a varnish having a resin content of 60%. Abase material was immersed in the varnish to impregnate the base material with resin, and then the base material was dried at a temperature of 160° C. for 3 minutes, whereby preregs were obtained. Four prepregs obtained above were stacked and 12 µm thick electrolytic copper foils were disposed on both surfaces of the stacked prepregs, one copper foil on each surface, and the resultant set was pressed at a temperature of 200° C. under a pressure of 2 MPa for 2 hours to prepare a double-sided copper-clad laminate having a thickness of 0.4 mm. Further, the prepregs were placed on both surfaces of a double-side patterned core material (copper foil thickness 35 µm), one prepreg on each surface, 18 µm thick electrolytic copper foils were laminated thereon, one copper foil on each surface, and the resultant set was pressed at a temperature of 200° C. at a pressure of 2 MPa for 2 hours, to obtain a four-layered board. The double-sided copper-clad laminate was evaluated for properties and the four-layered board was evaluated for moldability. Table 7 shows results thereof.

TABLE 6

| | Examples | | | | | | Comparative Examples | |
|---|---|---|---|---|---|---|---|---|
| | 10 | 11 | 12 | 13 | 14 | 15 | 4 | 5 |
| Resin B | 100 | | 70 | 70 | 60 | 60 | 70 | |
| Resin D | | 100 | | | | | | |
| BT2110 | | | 15 | | 20 | 20 | 15 | 40 |
| FR53 | | | | 30 | 20 | 20 | | |
| EPICLON153 | | | 15 | | | | 15 | 30 |
| PPE | | | | | | | | 30 |
| Zinc octylate | | | 0.01 | | 0.01 | 0.01 | 0.01 | 0.02 |
| Substrate used | V | V | V | V | V | A | E | D |

BT2110: bismaleimide triazine prepolymer (supplied by Mitsubishi Gas Chemical Company, Inc.)

FR53: Brominated polycarbonate: (supplied by Mitsubishi Gas Chemical Company, Inc.)

EPICLON153: supplied by Dainippon Ink and Chemicals, Inc.

PPE: supplied by Mitsubishi Gas Chemical Co., Inc., weight average molecular weight: 24,000

V: Vecls (aromatic polyester nonwoven fabric, supplied by KURARAY CO., LTD., weight: 50 g/m²)

A: KEVLAR (polyamide nonwoven fabric, supplied by Dupont, weight 40 g/m²)

E: Glass cloth for laminate (E glass, supplied by Nitto Boseki Co., Ltd., weight 110 g/m²)

Copper foil: 3EC-III (supplied by Mitsui Mining and Smelting Co., Ltd.)

TABLE 7

| | Examples | | | | | | Comparative Examples | |
|---|---|---|---|---|---|---|---|---|
| | 10 | 11 | 12 | 13 | 14 | 15 | 4 | 5 |
| Dielectric constant | 2.7 | 2.8 | 3.0 | 3.1 | 3.1 | 3.1 | 3.9 | 3.4 |
| Dielectric loss tangent | 0.003 | 0.003 | 0.004 | 0.004 | 0.004 | 0.004 | 0.005 | 0.004 |
| Heat resistance | o | o | o | o | o | o | o | Δ |
| Moldability | o | o | o | o | o | o | o | Δ |

Dielectric constant and dielectric loss tangent: Measured by a cavity resonance perturbation method (measurement frequency 1 GHz).

Heat resistance: A specimen was immersed in boiled water for 1 hour and then immersed in a solder bath at 260° C. for 30 seconds. The appearance of the specimen was checked by visual observation. (o: no swelling found, Δ: little swelling found, x: large swelling found)

Moldability: Embeddability of an internal layer pattern of four-layered board was visually judged. (o: no void found, x: little void found, large void found)

What is claimed is:

1. A prepreg for a laminate, comprising a resin composition containing at least 10% by weight of a vinyl compound represented by the formula (1) and an organic polymer base material,

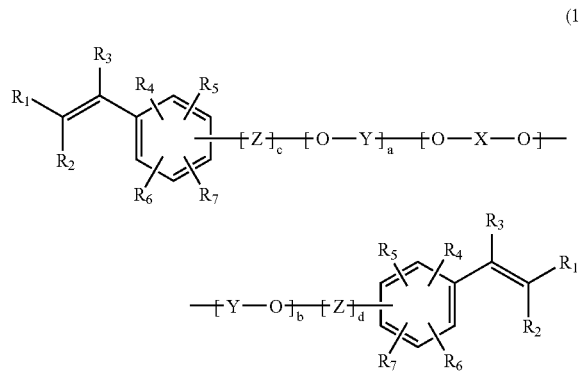

(1)

wherein:

$R_1$, $R_2$, $R_3$, $R_4$, $R_5$, $R_6$ and $R_7$ are the same or different and represent a hydrogen atom, a halogen atom, an alkyl group, a halogenated alkyl group or a phenyl group, —(O—X—O)— represents a moiety of the formula (2) or the formula (3) or represents at least two kinds of moieties of the formula (2) and/or the formula (3),

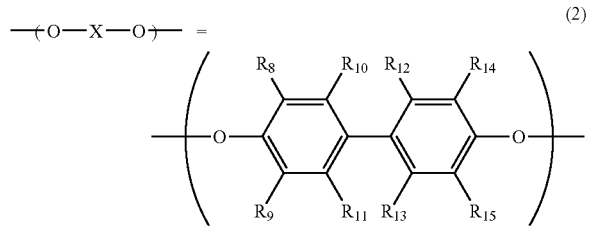

(2)

in which $R_8$, $R_9$, $R_{10}$, $R_{14}$ and $R_{15}$ are the same or different and represent a halogen atom, an alkyl group having 6 or less carbon atoms or a phenyl group and $R_{11}$, $R_{12}$ and $R_{13}$ are the same or different and represent a hydrogen atom, a halogen atom, an alkyl group having 6 or less carbon atoms or a phenyl group,

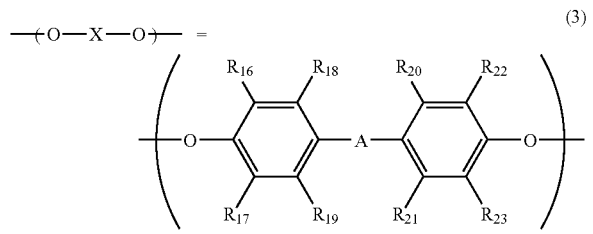

(3)

in which $R_{16}$, $R_{17}$, $R_{22}$ and $R_{23}$ are the same or different and represent a halogen atom, an alkyl group having 6 or less carbon atoms or a phenyl group, $R_{18}$, $R_{19}$, $R_{20}$ and $R_{21}$ are the same or different and represent a hydrogen atom, a halogen atom, an alkyl group having 6 or less carbon atoms or a phenyl group, and A is a linear, branched or cyclic hydrocarbon having 20 or less carbon atoms, —(Y—O)— is a moiety of the formula (4) or a random arrangement of at least two kinds of moieties of the formula (4),

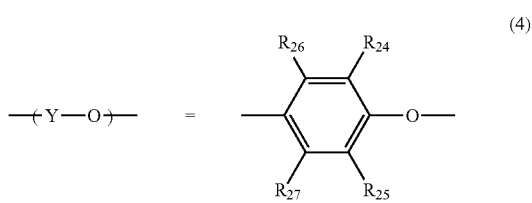

(4)

in which $R_{24}$ and $R_{25}$ are the same or different and represent a halogen atom, an alkyl group having 6 or less carbon atoms or a phenyl group and $R_{26}$ and $R_{27}$ are the same or different and represent a hydrogen atom, a halogen atom, an alkyl group having 6 or less carbon atoms or a phenyl group, Z is an organic group having at least one carbon atom which may contain an oxygen atom, a nitrogen atom, a sulfur atom or a halogen atom, each of a and b is an integer of 0 to 30, provided that at least one of a and b is not 0, and each of c and d is an integer of 0 or 1.

2. A prepreg according to claim 1, wherein the vinyl compound has a number average molecular weight of 500 to 3,000.

3. A prepreg according to claim 1, wherein —(O—X—O)— in the vinyl compound is a moiety of the formula (5) or the formula (6) and —(Y—O)— in the vinyl compound is a moiety of the formula (7) or the formula (8) or a random arrangement of moieties of the formula (7) and the formula (8),

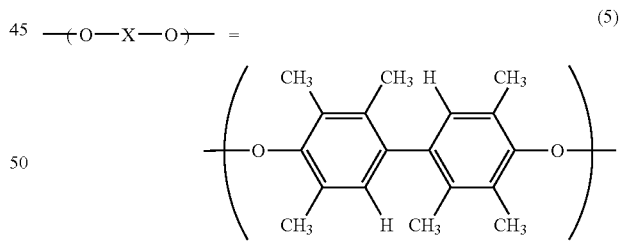

(5)

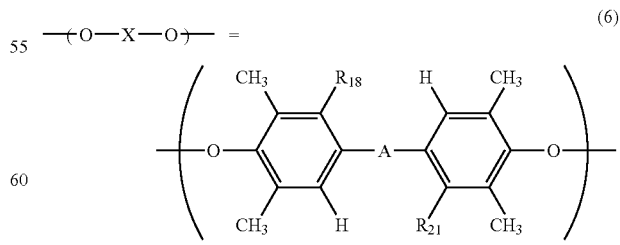

(6)

in which $R_{18}$ and $R_{19}$ are hydrogen atoms or methyl groups and A is a linear, branched or cyclic hydrocarbon having 20 or less carbon atoms,

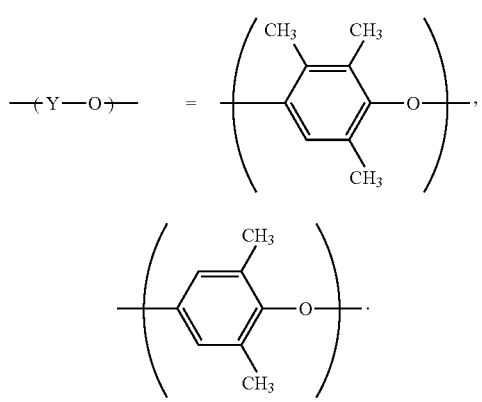

4. A prepreg according to claim 1 wherein the resin composition further contains a thermosetting resin and/or a thermoplastic resin.

5. A metal-clad laminate obtainable by placing one prepreg recited in claim 1 or stacking at least two prepregs recited in claim 1, laminating metal foil(s) on one surface or an upper surface and a lower surface of the prepreg or the stacked prepregs and heating and pressurizing the resultant set.

* * * * *